United States Patent [19]

Gardner et al.

[11] Patent Number: 4,840,302

[45] Date of Patent: Jun. 20, 1989

[54] CHROMIUM-TITANIUM ALLOY

[75] Inventors: David A. Gardner; James G. Ryan, both of Essex Jct.; Joseph G. Schaefer, Berkshire; Erick G. Walton, So. Burlington, all of Vt.

[73] Assignee: International Business Machines Corporation, Armonk, N.Y.

[21] Appl. No.: 181,882

[22] Filed: Apr. 15, 1988

[51] Int. Cl.[4] .................... B23K 1/20; H01L 23/48; H01L 29/54

[52] U.S. Cl. .................... 228/123; 228/254; 228/263.12; 357/67; 357/71; 428/610; 428/620; 428/628

[58] Field of Search .................... 228/123, 180.2, 254, 228/263.12; 428/547, 610, 620, 628; 357/67, 71; 29/840, 843, 874, 879

[56] References Cited

U.S. PATENT DOCUMENTS

| | | |
|---|---|---|
| 3,392,442 | 7/1968 | Napier et al. .................... 228/123 |
| 3,567,508 | 3/1971 | Cox . |
| 3,959,047 | 5/1976 | Alberts et al. . |
| 4,146,607 | 8/1979 | Theil et al. . |
| 4,231,058 | 10/1980 | Gleason . |
| 4,268,849 | 5/1981 | Gray et al. . |
| 4,360,142 | 11/1982 | Carpenter et al. .................... 228/254 |
| 4,463,059 | 7/1984 | Bhattacharyya et al. . |
| 4,513,905 | 4/1985 | Nowicki et al. .................... 228/123 |

OTHER PUBLICATIONS

Mechanical and Surface Analytical Studies of Titanium/Polyimide Adeshion, "Proceedings of the Symposium on Multi-Level Metallization, Interconnection", and Contact Technologies, vol. 87-4, pp. 144-149, by Furman et al.

"Adhesion on Evaporated Titanium to Polyethylene: Effects of Ion Bombardment Pretreatment", J. Voc. Sci. Technol. A, pp. 1498-1502, vol. 2, No. 4, Oct-Dec. 1984, by Bodo et al.

Primary Examiner—Nicholas P. Godici
Assistant Examiner—Samuel M. Heinrich
Attorney, Agent, or Firm—Sughrue, Mion, Zinn, Macpeak & Seas

[57] ABSTRACT

An alloy for contacting portions of a conductive interconnect layer exposed by an overlying organic insulating layer having apertures therethrough. The alloy contains chromium and titanium, and is formed such that at least 50 atm % of the total content of the alloy is titanium at the alloy-insulating layer interface.

15 Claims, 3 Drawing Sheets

CHROMIUM-TITANIUM ALLOY

DESCRIPTION

1. Technical Field

The present invention relates generally to the field of metal adhesion to polymers, and more specifically to a method of fabricating same.

BACKGROUND ART

In current semiconductor processing technology, lead/tin solders are used to couple the metal interconnect layers of a semiconductor chip to, for example, the leads of a chip carrier package. In this technology, a pad limiting metallurgy ("PLM") consisting of a plurality of metal layers (typically chromium, copper and gold layers) is used to provide a wetting surface for the solder during reflow while also insuring ohmic contact to the underlying metal layers. It is particularly important for the PLM to be mechanically sturdy, and to have a low contact resistance. A low PLM to metal contact resistance using so-called "wet cleaning" techniques (e.g. a chemical solution of phosphoric acid, chromium trioxide and water) has been obtained using a barrier layer of pure titanium in the PLM. However, the adhesion of the titanium PLM to the underlying organic layer (as measured by an Instron pull test measurement tool) decreases to unacceptable levels upon subsequent thermal cycling, (e.g., during the course of joining the deposited solder bumps to a chip carrier). This decrease in adhesion becomes even more pronounced after several chip join cycles. In general, the decrease in adhesion is believed to be caused by a titanium-polyimide chemical reaction. The article entitled "Mechanical and Surface Analytical studies of Titanium/Polyimide Adhesion," *Proceedings of the Symposium on Multilevel Metallization, Interconnection, and Contact Technologies,* Volume 87-4, pgs. 144–149, by Furman et al, discusses the titanium-polyimide adhesion problem in detail.

This adhesion failure is absent when a pure chromium barrier layer is formed in the PLM. However, the sputter cleaning techniques (e.g. gas plasma) required to obtain low chromium PLM to metal contact resistance will cause charge accumulation on the underlying metal layer, thereby degrading the performance of the active and/or passive devices interconnected by the metal layer. Moreover, sputter clean cycles are exceedingly slow, and as such are not conducive to volume manufacturing applications.

The following references are examples of the state of the PLM fabrication art where it is generally known to form a barrier layer in the PLM from chromium-based alloys.

U.S. Pat. No. 3,567,508 to Cox et al discloses a method of forming a metallic electrical contact on a semiconductor body wherein a barrier layer consists of a host of active metals including titanium, vanadium, chromium, niobium, zirconium, palladium, tantalum and intermetallic compounds thereof.

U.S. Pat. No. 4,231,058 to Gleason discloses a metallization layer for a trapped plasma avalanche triggered transit (TRAPATT) diode wherein the metallization layer consists of 56% W, 24% Ti and 20% Cr.

U.S. Pat. No. 4,268,849 to Gray et al discloses a raised bonding pad structure in which the barrier layer of the structure consists of a nickel-chromium alloy layer. The alloy layer may have varying amounts of nickel up to 80% by weight.

U.S. Pat. No. 4,463,059 to Bhattacharyya et al discloses a layered metal film structure for LSI chip carriers. The structure includes a thin adhesion layer consisting of Cr, Ti or other group IVB, VB or VIB metals. The top surface metallurgy of the structure includes layers of Cu, Cr and Au.

U.S. Pat. No. 4,164,607 to Thiel et al discloses a thin film resistor including an alloy layer, consisting of nickel, chromium and gold.

U.S. Pat. No. 3,959,047 to Alberts et al discloses a method of manufacturing semiconductor integrated circuitry. The method includes the step of depositing a composite metal film consisting of chromium, copper and gold.

The article entitled "Adhesion of Evaporated Titanium to Polyethylene: Effects of Ion Bombardment Pretreatment," *J. Vac. Sci. Technol.* A, pgs. 1498–1502, Vol. 2, No. 4., Oct.-Dec. 1984, by Bodo et al, discloses the effects on the adhesion of evaporated Ti to polyethylene (PE) when $Ar+$ is bombarded onto the surface of the PE prior to film deposition.

None of the previous or existing PLM structures providing both low contact resistance and high adhesion to underlying organic layers can be implemented with wet pre-cleaning techniques. As a result, there remains a continuing need in the art for a PLM structure which can be implemented with wet pre-cleaning techniques, and which exhibits both low contact resistance and optimized adhesion characteristics.

SUMMARY OF THE INVENTION

Thus, it is an object of the present invention to provide a PLM structure and method of making same which utilize wet pre-cleaning techniques, a low PLM to metal contact resistance and an acceptable pull strength between the PLM and the substrate.

This and other objects are realized in the present invention which provides a conductive structure which includes a chromium-titanium alloy formed over an organic insulating layer having a contact aperture, wherein the titanium comprises at least 50 atomic percent of the total alloy content at the alloy-organic insulating layer interface. The method of the invention includes the step of cleaning the exposed metal using a wet etchant, and then depositing a titanium-chromium alloy barrier layer over an organic insulating layer, wherein titanium comprises at least 50 atomic percent of the total alloy barrier layer at the alloy-organic insulating layer interface.

DESCRIPTION OF THE PREFERRED EMBODIMENT

Figure 1:
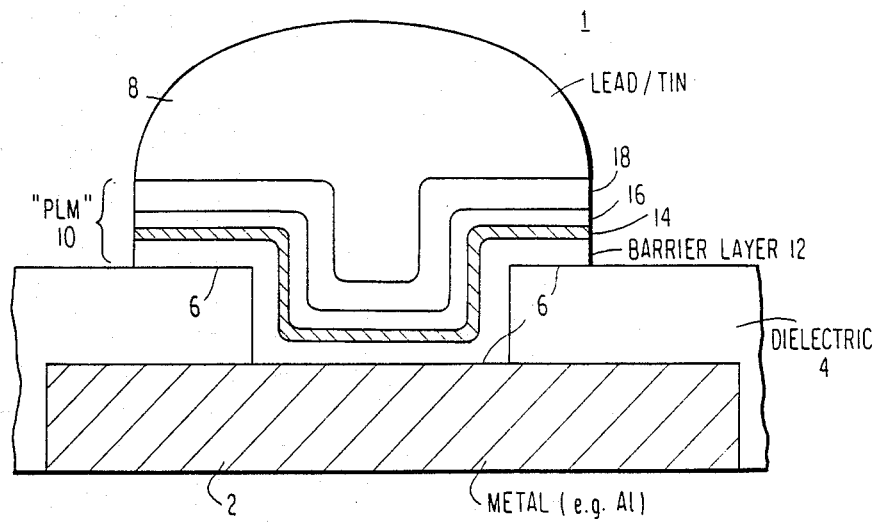
FIG. 1 is a cross-sectional view of a semiconductor structure according to the invention.

FIG. 1 shows a bonding pad structure 1 of a semiconductor chip according to the present invention. The structure includes a metal interconnect layer 2 which serves to interconnect the underlying circuitry of the semiconductor chip. Overlying the metal interconnect layer 2 is an organic insulating or dielectric coating 4. The metal interconnect layer 2 is coupled to a lead/tin solder ball 8 through PLM 10. The PLM 10 comprises a barrier/contact layer 12 forming an interface 6 to the underlaying layers, an intermediate layer 14, a thick middle layer 16 and an outer layer or coating 18. The barrier/contact layer 12 consists of a chromium-titanium alloy. The steps of fabricating the bonding pad structure 1 will now be described in detail below.

The metal interconnect layer 2 is formed on the semiconductor body by conventional techniques, and serves as an interconnect layer for the underlying circuitry of the semiconductor chip. The metal interconnect layer may consist of any metal that has a melting point greater than approximately 400° C., for example aluminum, aluminum-based alloys (e.g., Al/Si, Al/Cu, Al/Si/Cu), refractory metals (e.g., Group IVB-VIB metals), refractory metal silicides, silver, copper, gold, and intermetallic compounds thereof. Of these, aluminum-based alloys are preferred. An organic insulating or dielectric layer 4 is coated on the metal layer 2. The organic layer 4 can be made of commercially available polyimides (e.g., PI 2555 manufactured by E. I. DuPont de Neumours, Inc.; PIQ manufactured by Hitachi, etc.), polysiloxanes, and polyethylene. PI 2555 is preferred. Next, holes are cut in the organic layer 4 until the surface of the metal interconnect layer 2 is exposed by conventional techniques. The exposed portion of metal interconnect layer 2 is then cleaned with a suitable acid etching/cleaning solution to remove any unwanted metal oxide on its surface. More particularly, the metal interconnect layer 2 is cleaned by exposure to a mixture of concentrated phosphoric acid, chromium trioxide and $H_2O$ in a 1:1:50 (milliliters:grams:milliliters) ratio at a temperature of approximately 70° C., such that any remaining oxide on its surface has a maximum thickness between 20-40 angstroms, which allows the metal interconnect layer 2 to make ohmic contact with overlaying metals. The layers of the PLM 10 of the bonding pad structure 1 are then deposited by vacuum deposition techniques such as evaporation, sputtering or chemical vapor deposition, using conventional techniques. Of these, evaporation is preferred. For example, the barrier layer 12 may formed by co-evaporating chromium and titanium onto the organic layer 4. More specifically, this may be accomplished by placing chromium and titanium source material on a tungsten boat (i.e., support material) and resistively heating the boat to cause evaporation. The resulting chromium-titanium alloy layer 12 is formed such that it has a thickness between 500 angstroms and 2000 angstroms (1,500 angstroms is preferred) and a consistency such that at least 50 atomic percent of the total alloy content at the interface 6 is titanium. Because of the relatively high vapor pressure of chromium, at least 87 atomic percent of the evaporation source material for the alloy layer will contain titanium. This ensures that at least 50 atomic percent of the total alloy content at the interface of the alloy layer 12 and the organic insulating layer 4 is titanium. Following the evaporation of the chromium-titanium alloy layer 12, a relatively thick layer of copper is phased in from the chromium-titanium alloy layer. As a result, an intermediate layer 14 of about 1,000 angstroms is formed over the barrier layer 12 consisting of about 50% by volume Cr—Ti and 50% by volume copper. The intermediate layer 14 is followed by a pure copper layer 16 having a thickness of about 10,000 angstroms. A thin layer 18 of gold is then evaporated onto the copper layer 16 to a thickness of about 1,500 angstroms. Alternatively, the gold layer 18 may be phased in from the copper layer, thereby forming a second intermediate layer of copper and gold between the copper layer 16 and the gold layer 18. Next, lead and tin source material is evaporated onto the gold layer 18 though a mask forming a basically conical structure. Since this conical lead/tin structure is usually not suitable for connecting the chip to a particular substrate, the chip including the conical structure typically undergoes reflow in a hydrogen atmosphere at a peak temperature of about 360° C. to re-form the lead/tin conical structure into the solder ball pad structure 1. The resulting structure then undergoes a "chip join cycle" (defined below) in a hydrogen-containing and/or nitrogen-containing atmosphere at a peak temperature of about 360° C., to connect the chip to the appropriate substrate, thereby forming external connections. A "chip join cycle" refers to the thermal cycle of placing the chip into a furnace or other suitable heating device, heating the chip to a temperature such that the solder ball melts, and cooling the chip so that the connection is formed, thereby soldering the chip to the desired substrate. During the chip join cycle, the PLM 10 of the bonding pad structure 1 undergoes stress. More particularly, as the chip is heated and then cooled, the metallurgy of the PLM expands and contracts, respectively, thereby causing stress to increase at the PLM-organic layer interface. Often, the chip undergoes numerous chip join cycles due to, for example, manufacturing defects or incorrectly placed solder ball connections.

As indicated, the invention includes the use of a chromium-titanium alloy barrier layer in the PLM of the bonding pad structure such that at least 50 atomic percent of the alloy is titanium at the interface of the alloy barrier layer 12 and the organic insulator layer 4. The resulting structure 1 of the invention has a low contact resistance, and exhibits a pull strength which closely resembles the pull strength obtained when a pure chromium barrier layer is formed in the PLM 10. However, unlike chromium, the Cr—Ti alloy barrier layer 12 is compatible with wet pre-cleaning techniques.

Figure 2:
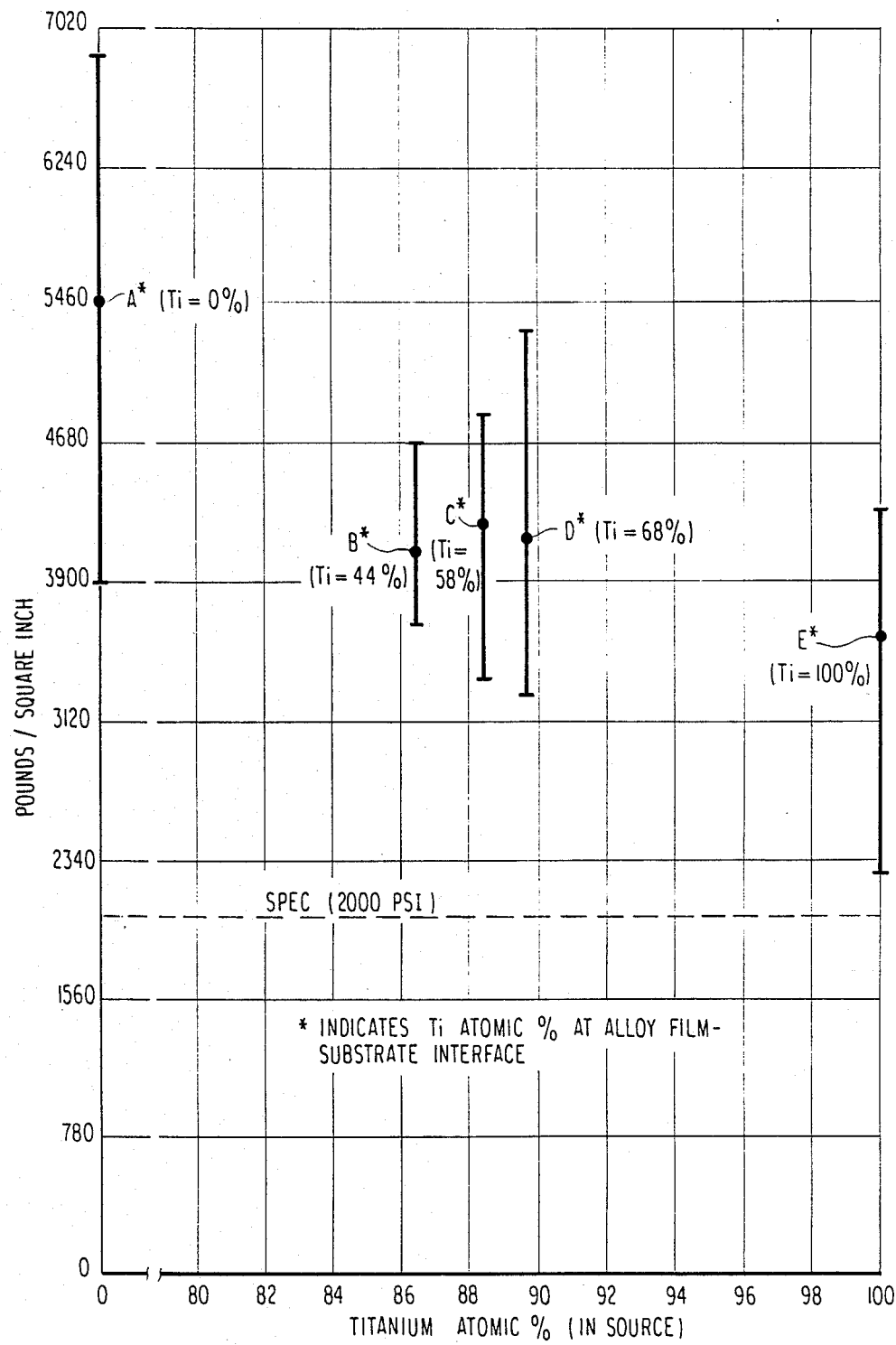
FIG. 2 is a graph showing the static pull strength (after 6 chip join cycles) of PLMs having different barrier layer compositions.
Figure 3:
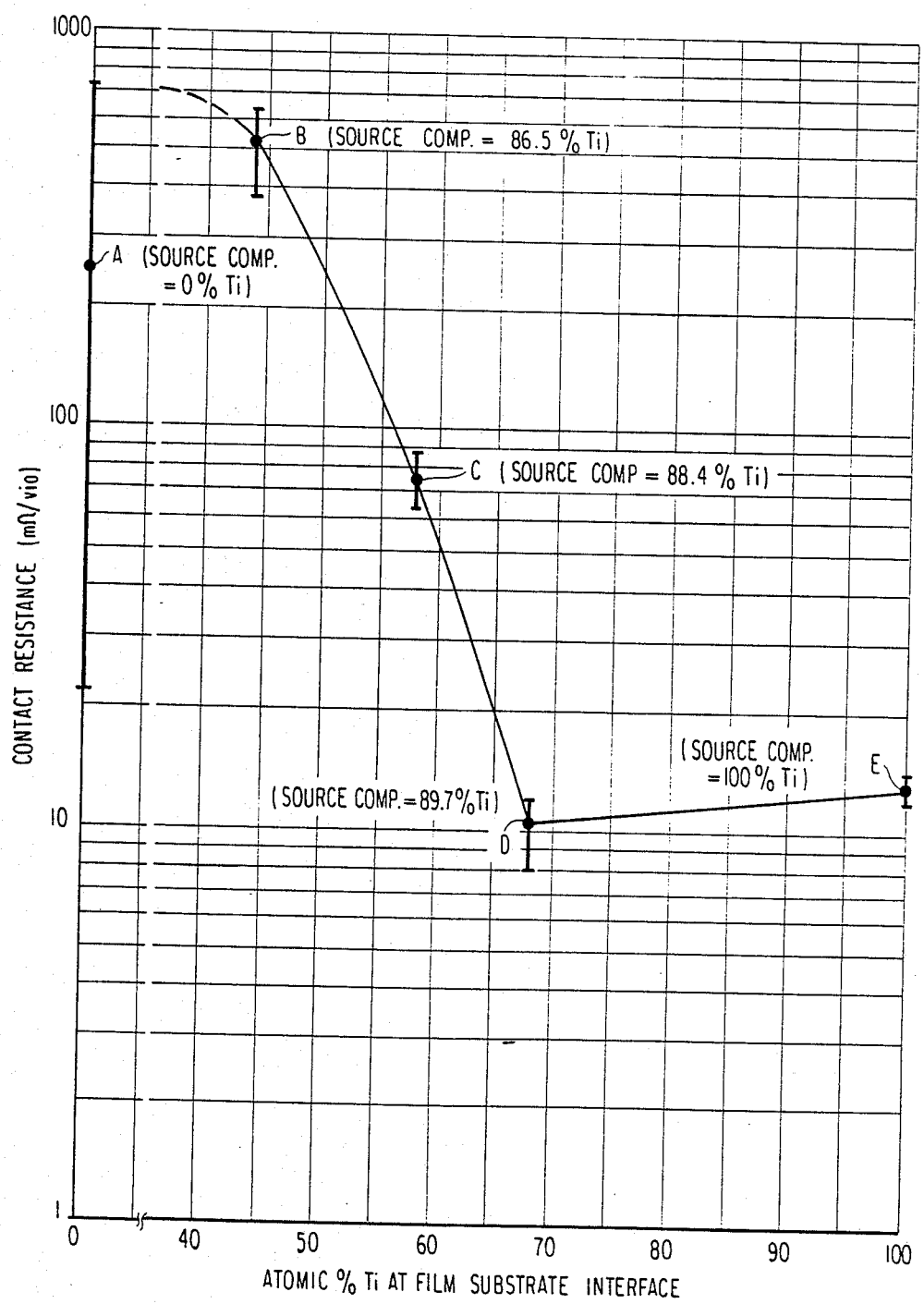
FIG. 3 is a graph showing contact resistance as a function of Ti atom % in the barrier layer.

FIG. 2 is a graph showing the static pull strength of pad structures having different barrier layer compositions. The upper and lower limits of each line indicate the highest and lowest pull strength values, respectively, of five pad structures having the same barrier layer compositions. The point within each data line indicates the average pull strength of the five pad structures. The test results were obtained after the pad structures were subjected to six chip join cycles. Data line A depicts the range of pull strengths of pad structures having a pure chromium barrier layer. Data lines B-D depict the range of pull strengths of pad structures having a Cr—Ti barrier layer of different atomic percentages (in data line B, Ti=44 atom %; in data line C, Ti=58 atom %; and in data line D, Ti=68 atom %). Finally, data line E depicts the range of pull strengths of pad structures having pure titanium barrier layers. The pure chromium barrier layer was prepared by deposition and RF sputter cleaning, while the Ti and Cr—Ti barrier layers were prepared by deposition and wet cleaning. In general, the data indicates that all of the barrier layers provide pull strengths greater that the 2000 psi needed to form a reliable device. Below about 2000 psi, the strength of the adhesive link between PLM and chip substrate may be weaker than the cohesive strength of the solder column itself. Note that both the range and average of the pull strengths for pure Cr barrier layers is much greater/higher respectively, than those of both the Cr—Ti alloys and pure Ti. Moreover, note that the highest pull strength values for Cr—Ti alloys, in terms of both ranges and averages, were achieved when Ti=approximately 60%-70% of the alloy. Above approximately 70% Ti, the pull strength of the Cr—Ti alloy should drop to that of pure Ti. With reference to FIG. 3, there is shown a graph of the ranges of contact resistance (in milli ohms/via) in relation to the atomic percent of titanium in the Ti—Cr alloy at the film-substrate interface. As shown in FIG. 3, when the titanium percentage is below approximately 50%, the contact resistance after reflow is more than 300 mohms/via. In general, contact resistance should be no more than 250 milliohms/via to provide adequate signal propagation speeds for state-of-the-art logic and memory devices. This criterion is met with a Ti atom % of at least 50% (i.e., a source composition of approximately 87 atom %-88 atom % Ti, balance Cr). In general, it is desirable to minimize contact resistance while maximizing pull strength. It is preferable to provide a contact resistance of 100 mohms/via or less. Thus, as is apparent upon comparing FIGS. 2 and 3, the resistance pull strength tradeoff is optimized when Ti=approximately 60-70 atom % of the alloy. As indicated above, at least about 87 atom % of titanium is required in the source to allow the interface between the alloy barrier layer 12 and the underlying organic insulating layer 4 to contain at least 50% titanium.

It will be appreciated by those skilled in the art that the invention may be carried out in various ways and take various forms and embodiments other than the specific embodiment disclosed. Accordingly, it is understood that the scope of the invention is limited only by the following claims.

What we claim is:

1. An alloy layer for contacting portions of a conductive layer exposed through an overlying organic insulator layer disposed on a substrate, consisting of chromium and titanium, wherein at least 50 atm % of the alloy content at a lower surface thereof is titanium.

2. The alloy layer according to claim 1, wherein approximately 60-70 atm % of the total alloy content at a lower surface thereof is titanium.

3. The alloy layer according to claim 1, wherein said conductive structure comprises a material selected from the group consisting of aluminum, aluminum-based alloys, refractory metals, refractory metal silicides, silver, copper, gold, and intermetallic compounds thereof.

4. The alloy layer according to claim 1, wherein said organic insulating material comprises a material selected from the group consisting of polyimide, polysiloxane, and polyethylene.

5. In a metallurgy structure disposed on a substrate for establishing electrical contact to portions of a conductive layer exposed, by an overlaying organic insulating layer, the metallurgy structure having a barrier layer and at least one other metal layer disposed on the barrier layer, the improvement wherein the barrier layer comprises a chromium-titanium alloy having at least 50 atm % titanium at a lower surface thereof in contact with the organic insulating layer and the conductive layer.

6. The metallurgy structure according to claim 5, wherein said at least one other metal layer consists of copper.

7. The metallurgy structure according to claim 5, further comprising a second metal layer.

8. The metallurgy structure according to claim 7, wherein said second metal layer consists of gold.

9. The metallurgy structure according to claim 7, further comprising a solder ball disposed on said second metal layer.

10. The metallurgy structure according to claim 9, wherein said solder ball is an alloy consisting of tin and lead.

11. A method of producing a chromium-titanium alloy layer for contacting portions of a conductive layer exposed by an organic insulator layer having apertures therethrough, comprising the steps of:
cleaning exposed portions of the conductive layer by exposure to a wet etchant solution; and
depositing the alloy layer over the organic insulating layer so that at least 50 atom % of the total alloy content at the layer-organic insulating layer interface is titanium.

12. The method according to claim 11, wherein said alloy is deposited by evaporation from a source material comprising at least approximately 87 atom %-88 atom % titanium and at most approximately 13 atom %-12 atom % chromium.

13. The method according to claim 12, wherein said evaporation comprises the steps of:
placing said source material on a tungsten boat; and
resistively heating the boat, thereby causing coevaporation of the chromium and titanium.

14. A method of providing an interconnect structure for contacting portions of a conductive layer exposed by an organic layer having apertures therethrough, comprising the steps of:
producing a chromium-titanium alloy layer for contacting portions of a conductive layer exposed by an organic insulator having apertures therethrough, at least 50 atm. % of the alloy content at a lower surface of said produced alloy layer being titanium;
cleaning exposed portions of the conductive layer by exposure to a wet etchant solution;
depositing at least one additional conductive layer on said alloy layer;
forming a solder ball on said at least one additional conductive layer;
heating the solder ball to a temperature sufficient to melt said solder ball; and
cooling said solder ball, thereby connecting said solder ball to the substrate.

15. An alloy layer for contacting portions of a conductive layer exposed through an overlying organic layer disposed on a substrate, said alloy layer comprising: chromium and titanium, wherein at least 50 atm. % of the alloy content at only a lower surface thereof is titanium.

* * * * *